United States Patent
Schmidt et al.

(10) Patent No.: US 11,396,234 B2
(45) Date of Patent: Jul. 26, 2022

(54) BATTERY SYSTEM FOR AN ELECTRIC VEHICLE, METHOD FOR OPERATING A BATTERY SYSTEM, AND ELECTRIC VEHICLE

(71) Applicant: Robert Bosch GmbH, Stuttgart (DE)

(72) Inventors: Alexander Schmidt, Donaueschingen (DE); Christoph Woll, Gerlingen (DE)

(73) Assignee: Robert Bosch GmbH, Stuttgart (DE)

(\*) Notice: Subject to any disclaimer, the term of this patent is extended or adjusted under 35 U.S.C. 154(b) by 149 days.

(21) Appl. No.: 16/989,493

(22) Filed: Aug. 10, 2020

(65) Prior Publication Data
US 2021/0053444 A1 Feb. 25, 2021

(30) Foreign Application Priority Data

Aug. 21, 2019 (DE) .......................... 102019212479.8

(51) Int. Cl.
*B60L 3/00* (2019.01)
*H01M 10/48* (2006.01)
(Continued)

(52) U.S. Cl.
CPC ............. *B60L 3/0046* (2013.01); *B60L 58/12* (2019.02); *B60L 58/22* (2019.02); *G01R 31/396* (2019.01); *H01M 10/482* (2013.01); *H01M 2010/4278* (2013.01); *H01M 2220/20* (2013.01); *H01M 2220/30* (2013.01)

(58) Field of Classification Search
CPC ........ B60L 3/0046; B60L 58/12; B60L 58/22; G01R 31/396; G01R 31/371; G01R 31/392; G01R 35/00; H01M 10/482; H01M 2010/4278; H01M 2220/20;
(Continued)

(56) References Cited

U.S. PATENT DOCUMENTS 6,198,981 B1 * 3/2001 Nakamura ......... G05B 19/0421
700/121
9,647,301 B2 * 5/2017 Mizobe ............... H01M 10/482
(Continued)

FOREIGN PATENT DOCUMENTS

CN 101162844 A * 4/2008 ............ H02J 7/0022
DE 102011079126 A1 1/2013
(Continued)

*Primary Examiner* — M Baye Diao
(74) *Attorney, Agent, or Firm* — Norton Rose Fulbright US LLP; Gerard Messina

(57) ABSTRACT

A battery system for an electric vehicle. The electric vehicle includes a plurality of serially interconnected battery modules, each battery module having at least two battery cells interconnected in parallel, a master control unit for supervising the battery modules, and a slave control unit for supervising the battery modules. A master supervision unit having master sensors for detecting measured values of the battery cells and of the battery module and a slave supervision unit having slave sensors for detecting measured values of the battery cells and of the battery module are assigned to each battery module. The master supervision units communicate with the master control unit, the slave supervision units communicate with the slave control unit, and the master control unit communicates with the slave control unit.

14 Claims, 2 Drawing Sheets

(51) Int. Cl.
  *B60L 58/12* (2019.01)
  *G01R 31/396* (2019.01)
  *B60L 58/22* (2019.01)
  *H01M 10/42* (2006.01)

(58) Field of Classification Search
  CPC . H01M 2220/30; H01M 50/509; Y02E 60/10; Y02T 90/16; Y02T 10/70
  USPC .......................................................... 320/107
  See application file for complete search history.

(56) References Cited

U.S. PATENT DOCUMENTS

| | | | | |
|---|---|---|---|---|
| 10,024,921 | B2* | 7/2018 | Butzmann | ............ G01R 31/382 |
| 10,322,824 | B1 | 6/2019 | Demont et al. | |
| 11,056,732 | B2* | 7/2021 | Kim | ...................... H01M 10/48 |
| 2011/0254502 | A1 | 10/2011 | Yount et al. | |
| 2012/0203482 | A1 | 8/2012 | Parle et al. | |
| 2014/0330463 | A1* | 11/2014 | Jeong | ...................... B60L 58/22 |
| | | | | 320/134 |
| 2017/0220096 | A1* | 8/2017 | Lin | ...................... G06F 13/4022 |
| 2019/0031042 | A1 | 1/2019 | Muller | |
| 2019/0229650 | A1* | 7/2019 | Demont | .................. B60L 50/40 |
| 2020/0036194 | A1* | 1/2020 | Park | ...................... H01M 10/482 |
| 2020/0133757 | A1* | 4/2020 | Sung | ...................... G06F 11/079 |
| 2021/0278468 | A1* | 9/2021 | Kojima | .................. B60L 50/64 |
| 2021/0410222 | A1* | 12/2021 | Numata | .................. B60R 16/04 |

FOREIGN PATENT DOCUMENTS

| | | | | |
|---|---|---|---|---|
| DE | 102014214996 A1 | | 2/2016 | |
| EP | 2495800 A1 | | 9/2012 | |
| EP | 3245708 B1 | * | 3/2019 | .............. B60L 58/18 |
| EP | 3588728 A1 | | 1/2020 | |
| EP | 3896773 A1 | * | 10/2021 | ........ H01M 10/4207 |
| KR | 20140143076 A | * | 12/2014 | .......... H02J 7/00036 |
| KR | 20170056061 A | * | 5/2017 | ........ G01R 31/3658 |

* cited by examiner

BATTERY SYSTEM FOR AN ELECTRIC VEHICLE, METHOD FOR OPERATING A BATTERY SYSTEM, AND ELECTRIC VEHICLE

CROSS REFERENCE

The present application claims the benefit under 35 U.S.C. § 119 of German Patent Application No. DE 102019212479.8 filed on Aug. 21, 2019, which is expressly incorporated herein by reference in its entirety.

FIELD

The present invention relates to a battery system for an electric vehicle, which comprises a plurality of serially interconnected battery modules, each battery module having at least two battery cells interconnected in parallel, a master control unit for supervising the battery modules, and a slave control unit for supervising the battery modules. The present invention further relates to a method for operating a battery system in accordance with the present invention. The present invention furthermore relates to an electric vehicle.

BACKGROUND INFORMATION

Today's electrically driven vehicles, which are called electric vehicles, provide battery systems having multiple battery cells. The battery cells are interconnected not only serially, but also in parallel. A sufficiently high battery capacity and thus a high vehicle operating range are thereby achieved, but a required power output is thus provided as well. The parallel connection of such battery cells mostly occurs within a battery module, while multiple battery modules are serially connected to one another. Supervision units are assigned to the battery modules, which are also called CSC (cell supervising circuit).

The supervision units have sensors for detecting voltages and temperatures. Detected measured values are transmitted to a higher order control unit, which is also called a BCU (battery control unit).

Autonomously operated electric vehicles are subject to special requirements, in particular concerning roadworthiness, since a breakdown of such electric vehicles is particularly problematic. Depending on the degree of automation, these electric vehicles must satisfy a specific safety level (safe stop level, SSL). For this purpose, they are classified according to different risk levels (automotive safety integrity level, ASIL), which is connected to increased requirements with respect to the battery system.

If the control unit (BCU) or one of the supervision units (CSC) fails in a simple battery system, the battery system can no longer be operated and the electric vehicle breaks down. Fault-tolerant battery systems may have a redundancy, that is, a duplication, of individual sub-components, for example of battery modules, supervision units and control units, or of all sub-components. Such a duplication entails high costs and disadvantages with respect to space and weight of the battery system.

A battery system is described in U.S. Patent Application Publication No. US 2019/0031042 A1, which includes multiple battery modules, each of which have multiple battery cells. Multiple sensors are assigned to each of the battery cells, which detect, among other things, measured values for a temperature and a voltage of the respective battery cell. The sensors communicate with multiple supervision units.

A system and a method for detecting malfunctions of battery cells are described in U.S. Patent Application Publication No. US 2012/0203482 A1. First supervision units and second supervision units are provided, which are designed to be redundant.

A fault-tolerant battery management system is described in U.S. Patent Application Publication No. US 2011/0254502 A1. Such a system comprises for example two essentially identical, redundant sets of circuits for battery supervision and of circuits for a charge equalization between battery cells.

SUMMARY

A battery system is provided, in particular for an electric vehicle. The battery system comprises a plurality of serially interconnected battery modules, each battery module having at least two battery cells connected in parallel. The battery system further comprises a master control unit for supervising the battery modules and a slave control unit for supervising the battery modules.

The master control unit and the slave control unit preferably have an identical design and are equipped in particular with the same hardware and the same software. During the initial operation of the battery system in the electric vehicle, a master function is assigned only to one of the two control units, whereupon this control unit becomes the master control unit. There is thus a redundancy in the control unit.

According to the present invention, a master supervision unit having master sensors for detecting measured values of the battery cells as well as for detecting measured values of the battery module is assigned to each battery module. Likewise, a slave supervision unit having slave sensors for detecting measured values of the battery cells as well as for detecting measured values of the battery module is assigned to each battery module. There thus exists a redundancy in the supervision unit as well as in the sensors.

The measured values detected by the sensors include, for example, a temperature and a voltage of each individual battery cell as well as a temperature and a voltage of the entire battery module. The master supervision units and the slave supervision units preferably also have an identical design and are equipped in particular with the same hardware and the same software.

According to the present invention, the master supervision units communicate with the master control unit, the slave supervision units communicate with the slave control unit, and the master control unit communicates with the slave control unit.

For example, measured values of the battery cells and of the battery modules detected by the master sensors are transmitted from the master supervision units to the master control unit. Measured values of the battery cells and of the battery modules detected by the slave sensors are transmitted from the slave supervision units to the slave control unit. Furthermore, measured values are transmitted for example from the master control unit to the slave control unit as well as from the slave control unit to the master control unit.

According to one advantageous development of the present invention, initially, in particular immediately following the initial operation of the battery system in the electric vehicle, a master function is assigned to the master control unit. It is also possible, however, to assign the master function to the slave control unit, in particular, if a defect in the master control unit and/or a defect in one of the master supervision units and/or a defect in at least one master sensor of at least one master supervision unit is/are detected.

According to one advantageous development of the present invention, the battery system further comprises at least one main switch for switching off the battery modules. The main switch is connected in series with the battery modules and is controllable by the control unit to which the master function is assigned.

A method is also provided for operating a battery system in accordance with the present invention. For this purpose, measured values of the battery cells as well as measured values of the battery modules, which are detected by the master sensors, are transmitted from the master supervision units to the master control unit. The measured values are transmitted further from the master control unit to the slave control unit. Likewise, measured values of the battery cells as well as measured values of the battery modules, which are detected by the slave sensors, are transmitted from the slave supervision units to the slave control unit. The measured values are transmitted further from the slave control unit to the master control unit.

According to one advantageous development of the present invention, the method comprises the following steps:

First, the measured values of the battery cells within one battery module are compared to one another, which measured values are detected by the master sensors of the master supervision unit that is assigned to said battery module. In this context, particularly the measured values for a temperature and the measured values for a voltage of the individual battery cells are compared to one another.

Likewise, the measured values of the battery cells within said battery module are compared to one another, which measured values are detected by the slave sensors of the slave supervision unit that is assigned to said battery module. In this instance too, particularly the measured values for a temperature and the measured values for a voltage of the individual battery cells are compared to one another.

A defect is detected if at least one measured value of at least one of the battery cells detected by the master sensors deviates significantly from corresponding measured values that are detected by the master sensors of the remaining battery cells of the battery module.

In this connection, two measured values deviate significantly from each other if a difference of the two measured values exceeds a specified threshold value. The threshold value is preferably greater than a measurement accuracy of the master sensors. This prevents simple measuring errors of the master sensors from being erroneously detected as a defect.

A defect is detected in said battery cell if its measured value detected by the master sensors deviates significantly from corresponding measured values that are detected by the master sensors of the remaining battery cells of the battery module, if the corresponding measured value of said battery cell detected by the slave sensors is approximately equal to the measured value of said battery cell detected by the master sensors. This means that the measured value of said battery cell detected by the slave sensors also deviates significantly from corresponding measured values that are detected by the slave sensors of the remaining battery cells of the battery module.

In this connection, two measured values are said to be approximately equal if a difference between the two measured values falls below or is equal to said specified threshold value. This prevents simple measuring errors of the master sensors from being erroneously detected as a defect in said battery cell.

A defect is detected in at least one master sensor of the master supervision unit if the corresponding measured value of the battery cell detected by the slave sensors deviates significantly from the measured value of said battery cell detected by the master sensors.

According to another advantageous development of the present invention, the method comprises the following steps:

First, the measured values of a battery module, which are detected by the master sensors of the master supervision unit assigned to said battery module, are compared with the measured values of the other battery modules, which are detected by the master sensors of the master supervision unit assigned to the respective battery module. For this purpose, particularly the measured values for a temperature and the measured values for a voltage of the individual battery modules are compared to one another.

Likewise, the measured values of said battery module, which are detected by the slave sensors of the slave supervision unit assigned to said battery module, are compared with the measured values of the other battery modules, which are detected by the slave sensors of the slave supervision unit assigned to the respective battery module. In this instance too, particularly the measured values for a temperature and the measured values for a voltage of the individual battery modules are compared to one another.

A defect is detected if at least one measured value of said battery module detected by the master sensors deviates significantly from corresponding measured values that are detected by the master sensors of the other battery modules.

A defect is detected in said battery module if the corresponding measured value of said battery module detected by the slave sensors approximately equals the measured value of said battery module detected by the master sensors.

A defect in the master supervision unit, which is assigned to said battery module, is detected if the corresponding measured value of said battery module detected by the slave sensors deviates significantly from the measured value of said battery module detected by the master sensors.

If a defect is detected in the master control unit and/or in a master supervision unit and/or in at least one master sensor of at least one master supervision unit, a master function, which is still assigned to the master control unit, is preferably assigned to the slave control unit.

If a defect is detected in at least one battery cell and/or in at least one battery module, at least one main switch for switching off the battery modules, which is connected in series to the battery modules, is preferably controlled by the control unit to which the master function is assigned. The control action opens the main switch and the battery modules of the battery system are switched off.

An electric vehicle is also provided, which comprises a battery system according to the present invention, which is operated using the method according to the present invention. The electric vehicle preferably has multiple battery systems according to the present invention, which are interconnected in particular in parallel.

The example battery system according to the present invention has a high fault tolerance, which is achieved by a redundancy in the sensor system/electronic system, that is, in the supervision units, control units and sensors. A redundancy of battery cells or battery modules is not required, which advantageously minimizes costs, space and weight of the battery system. The fact that measured values are always provided by two supervision units per battery module makes it possible to detect deviations and implausibilities immediately by a constant comparison of these measured values. The design of the battery system in combination with the operating method further yields the advantage of making it possible to distinguish clearly whether a defect exists in a battery cell, in a battery module or in the sensor system/electronic system. The use of available standard hardware in the sensor system/electronic system achieves a higher safety level in a cost-effective manner. A software extension in the monitoring functions of the supervision units allows for a clear detection of defects. An electric vehicle, which has a battery system according to the present invention, is able to continue to operate if only a defect in the sensor system/electronic system is detected, as long as the battery cells and battery modules are intact. An early detection of a signal drift also allows for a predictive diagnosis of components of the battery system.

BRIEF DESCRIPTION OF THE DRAWINGS

Specific embodiments of the present invention are explained in greater detail in the following description with reference to the figures.

DETAILED DESCRIPTION OF EXAMPLE EMBODIMENTS

Figure 1:
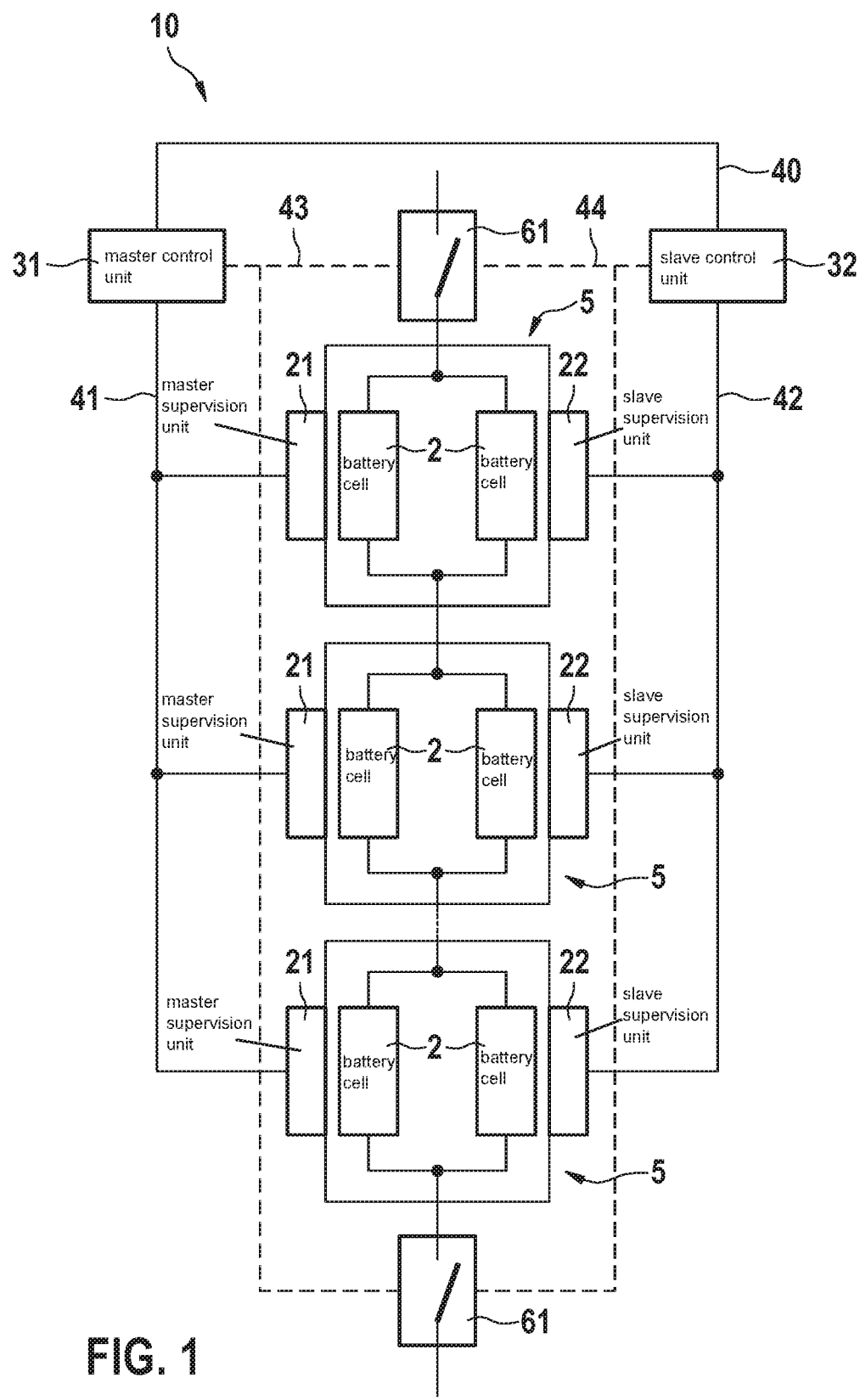
FIG. 1 shows a schematic representation of a battery system for an electric vehicle.

Identical or similar elements are designated by the same reference numerals in the following description of the specific embodiments of the present invention, a repeated description of these elements being omitted in individual cases. The figures represent the subject matter of the present invention only schematically.

FIG. 1 shows a schematic representation of a battery system 10 for an electric vehicle. Battery system 10 comprises a plurality of battery modules 5, which are interconnected in series. Each of the battery modules 5 has multiple, presently two, battery cells 2 interconnected in parallel. Said battery cells 2 are lithium-ion battery cells for example.

Battery system 10 further comprises a master control unit 31 for supervising battery modules 5 and a slave control unit 32 for supervising battery modules 5. A master supervision unit 21 having master sensors (not shown here) is assigned to each of the battery modules 5. Likewise, a slave supervision unit 22 having slave sensors (not shown here) is assigned to each of the battery modules 5.

Master control unit 31 communicates with master supervision units 21 via a first communication line 41. Slave control unit 32 communicates with slave supervision units 22 via a second communication line 42. Master control unit 31 communicates with slave control unit 32 via a bus line 40, for example via a CAN bus, which is designed to be fault-tolerant for safety reasons.

The master sensors as well as the slave sensors are used to detect measured values of battery cells 2 as well as to detect measured values of battery module 5. The measured values detected by the sensors include for example a temperature and a voltage of each individual battery cell 2 as well as a temperature and a voltage of the entire battery module 5. Since the battery cells 2 within battery module 5 are connected in parallel, the voltages of the individual battery cells 2 are in the faultless case identical and identical to the voltage of the entire battery module 5.

The measured values of battery cells 2 as well as of battery modules 5 detected by the master sensors are transmitted from master supervision units 21 to master control unit 31 via first communication line 41. The measured values of battery cells 2 as well as of battery modules 5 detected by the slave sensors are transmitted from slave supervision units 22 to slave control unit 32 via second communication line 42.

Additional variables of battery cells 2 and battery module 5, for example a state of charge, are calculated from the received measured values in the two control units 31, 32. Furthermore, a total voltage of battery system 10 is calculated from a sum of the voltages of battery modules 5. The total voltage of battery system 10 calculated in this manner is also compared with a measured total voltage of battery system 10.

Master control unit 31 transmits the measured values received from master supervision units 21 as well as further calculated variables to slave control unit 32. Slave control unit 32 compares the measured values received from master control unit 31 and additional variables with the measured values received from slave supervision units 22 and the variables calculated from the latter. Slave control unit 32 transmits the measured values received from slave supervision units 22 as well as further calculated variables to master control unit 31. Master control unit 31 compares the measured values received from slave control unit 32 and additional variables with the measured values received from master supervision units 21 and the variables calculated from the latter.

Battery system 10 further comprises two main switches 61 for switching off battery module 5. The two main switches 61 are connected in series to battery modules 5. Master control unit 31 is connected to the two main switches 61 via a first control line 43. Slave control unit 32 is connected to the two main switches 61 via a second control line 44. Via the control lines 43, 44, main switches 61 are able to be controlled by the control unit 31, 32 to which a master function is assigned.

Figure 2:
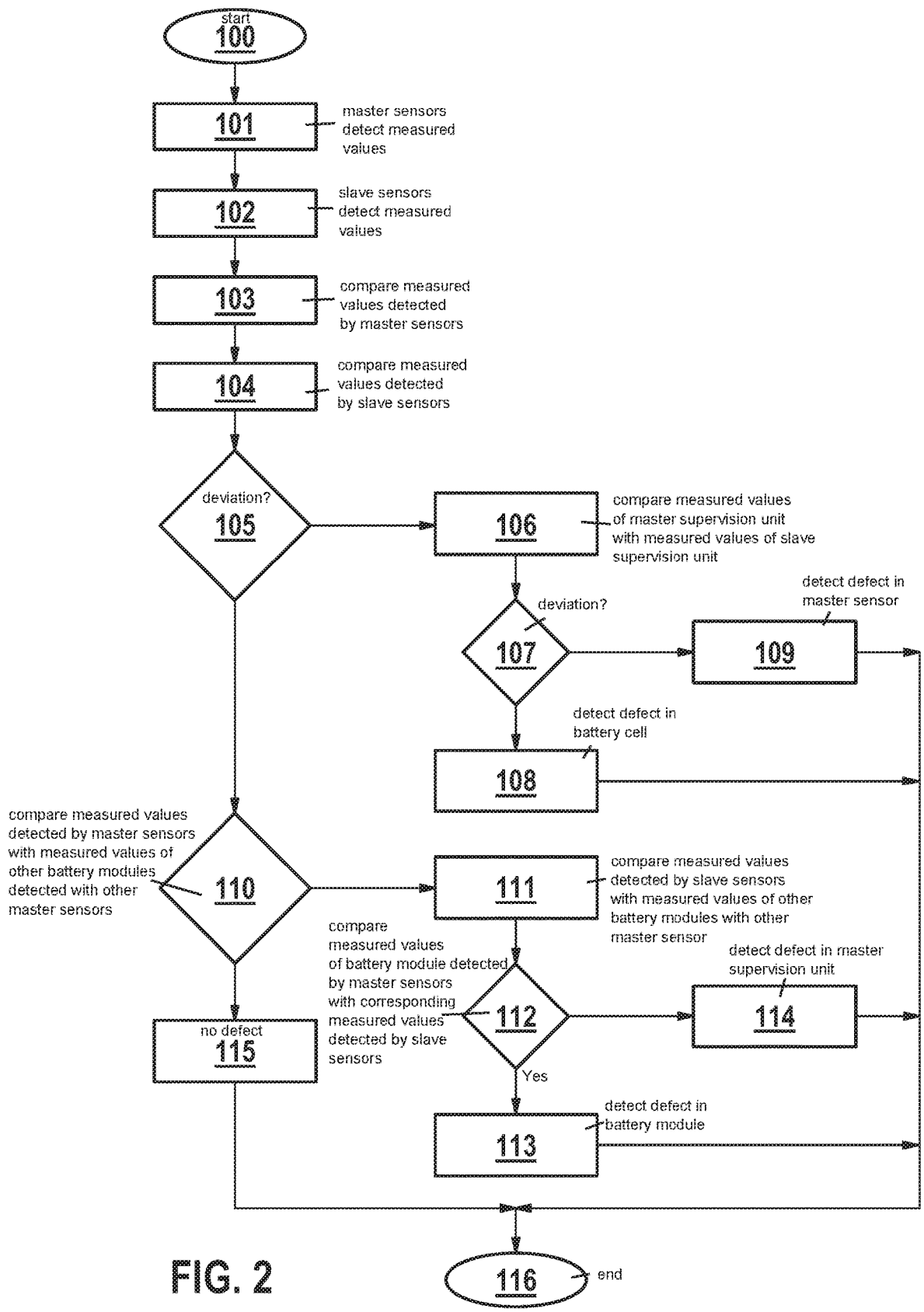
FIG. 2 shows a schematic representation of a method for operating the battery system.

FIG. 2 shows a schematic representation of a method for operating the battery system 10 shown in FIG. 1 in an electric vehicle. In an step of starting 100, the electric vehicle and thus also battery system 10 are started.

In a step 101, measured values, in particular for a temperature and a voltage of each individual battery cell 2 as well as for a temperature and a voltage of the entire battery module 5, are detected by the master sensors and are transmitted by the master supervision units 21 to the master control unit 31.

In a step 102, measured values, in particular for a temperature and a voltage of each individual battery cell 2 as well as for a temperature and a voltage of the entire battery module 5, are detected by the slave sensors and are transmitted by the slave supervision units 22 to the slave control unit 32.

In the faultless case, the individual voltage values of the same battery cell 2, which are ascertained by supervision units 21, 22, provide nearly the same voltage values; the scattering of measured values being at least very low. The analog signal values of the sensors are converted into digital signal values via A/D converters, which are situated on each circuit board of the individual supervision units 21, 22. These values are used by control units 31, 32 as input values for determining additional variables, for example the state of charge (SoC), the state of health (SoH) as well as the predicted current.

In a step 103, a comparison is performed of the measured values of the battery cells 2 within one battery module 5, which measured values are detected by the master sensors of the master supervision unit 21 that is assigned to said battery module 5. Particularly the measured values for a temperature and the measured values for a voltage of the individual battery cells 2 are compared to one another.

In a step 104, a comparison is performed of the measured values of the battery cells 2 within said battery module 5, which measured values are detected by the slave sensors of the slave supervision unit 22 that is assigned to said battery module 5. In this instance too, particularly the measured values for a temperature and the measured values for a voltage of the individual battery cells 2 are compared to one another.

In a step 105, the result of the comparison from step 103 is evaluated. If a measured value of a battery cell 2 of a battery module 5, measured by master supervision unit 21, deviates from the measured values of the remaining battery cells 2 of this battery module 5 by more than a threshold value, then it is reasonable to suspect that this battery cell 2 or a master sensor that supervises this battery cell 2 has a defect.

In a step 106, a comparison is performed between the measured values of master supervision unit 21 of said battery module 5 and the measured values of slave supervision unit 22 of said battery module 5. The result of this comparison is evaluated in a step 107.

If in the measured values of slave supervision unit 22 the measured value of this battery cell 2 also deviates from the measured values of the remaining battery cells 2 of said battery module 5, and if the measured values for this battery cell 2 from master supervision unit 21 and from slave supervision unit 22 are nearly identical, then a defect is detected in said battery cell 2 in a step 108.

If in the measured values of slave supervision unit 22 the measured value of this battery cell 2 does not deviate from the measured values of the remaining battery cells 2 of said battery module 5, and if the measured values for this battery cell 2 from master supervision unit 21 and from slave supervision unit 22 are different, then a defect is detected in a master sensor in a step 109.

If it is ascertained in step 105 that no measured value of a battery cell 2 of all battery modules 5, measured by master supervision unit 21, deviates from the measured values of the remaining battery cells 2 of this battery module 5 by more than a threshold value, then a comparison is performed in a step 110 between the measured values of a battery module 5, which are detected by the master sensors of the master supervision unit 21 assigned to said battery module 5, and the measured values of the other battery modules 5, which are detected by the master sensors of the master supervision unit 21 assigned to the respective battery module 5.

If at least one measured value of said battery module 5 detected by the master sensors deviates significantly from corresponding measured values detected by the master sensors of the other battery modules 5, then a comparison is performed in a step 111 also between the measured values of said battery module 5, which are detected by the slave sensors of the slave supervision unit 22 assigned to said battery module 5, and the measured values of the other battery modules 5, which are detected by the slave sensors of the slave supervision unit 22 assigned to the respective battery module 5.

In a step 112, the measured value of said battery module 5 detected by the master sensors is compared with the corresponding measured value detected by the slave sensors of said battery module 5.

If the corresponding measured value of said battery module 5 detected by the slave sensors is approximately equal to the measured value of said battery module 5 detected by the master sensors, then a defect is detected in said battery module 5 in a step 113.

If the corresponding measured value of said battery module 5 detected by the slave sensors deviates significantly from the measured value of said battery module 5 detected by the master sensors, then a defect is detected in a step 114 in the master supervision unit 21 that is assigned to said battery module 5. In this case, there is possibly a fault in an A/D converter on the circuit board of master supervision unit 21.

If no significant deviations are ascertained in step 110, then it is determined in a step 115 that there exists no defect in battery system 10.

The operation of battery system 10 and of the electric vehicle end at a later point in time in a final step 116.

The present invention is not limited to the exemplary embodiments described here and the aspects emphasized therein. Rather, within the framework indicated by the claims, a multitude of variations are possible which lie within the scope of the actions of one skilled in the art.

What is claimed is:

1. A battery system for an electric vehicle, comprising:
   a plurality of serially interconnected battery modules, each of the battery modules having at least two battery cells interconnected in parallel;
   a master control unit for supervising the battery modules; and
   a slave control unit for supervising the battery modules;
   wherein assigned to each battery module of the battery modules is: (i) a respective master supervision unit having master sensors for detecting measured values of the battery cells of the battery modules and of the battery modules, and (ii) a respective slave supervision unit having slave sensors for detecting measured values of the battery cells of the battery modules and of the battery modules;
   wherein the master supervision units are configured to communicate with the master control unit, and slave supervision units are configured to communicate with the slave control unit, and the master control unit is configured to communicate with the slave control unit.

2. The battery system as recited in claim 1, wherein a master function is assigned to the master control unit, and the master function is assignable to the slave control unit when a defect is detected: in the master control unit and/or in one of the master supervision units and/or in at least one master sensor of at least one of the master supervision units.

3. The battery system as recited in claim 2, further comprising:
   at least one main switch for switching off the battery modules, the least one main switch being connected in series to the battery modules, and is controllable by a control unit, including the master control unit or the slave control unit, to which the master function is assigned.

4. A method for operating a battery system, the method comprising:
   transmitting measured values of battery cells and battery modules, detected by master sensors, from master supervision units to a master control unit, and from the master control unit to a slave control unit, wherein the battery system includes a plurality of the battery modules, which are serially interconnected battery modules, each of the battery modules having at least two of the battery cells interconnected in parallel, the master control unit being configured for supervising the battery modules, the slave control unit being configured for supervising the battery modules, wherein assigned to each of the battery modules is: (i) a respective master supervision unit having master sensors for detecting the measured values of battery cells of the battery modules and of the battery modules, and (ii) a respective slave supervision unit having slave sensors for detecting the measured values of the battery cells of the battery modules and of the battery modules, and wherein the master supervision units are configured to communicate with the master control unit, and slave supervision units are configured to communicate with the slave control unit, and the master control unit is configured to communicate with the slave control unit; and transmitting measured values of the battery cells and of the battery modules, detected by the slave sensors, from the slave supervision units to the slave control unit, and from the slave control unit to the master control unit.

5. The method as recited in claim 4, further comprising:
comparing the measured values of the battery cells within one battery module with one another, which are detected by the master sensors of the master supervision unit assigned to the one battery module;
comparing the measured values of the battery cells within the one battery module with one another, which are detected by the slave sensors of the slave supervision unit assigned to one battery module; and
detecting a defect when at least one of the measured values of at least one of the battery cells of the one battery module detected by the master sensors deviates significantly from corresponding measured values, of remaining battery cells of the one battery module, detected by the master sensors.

6. The method as recited in claim 5, wherein a defect in the at least of the battery cells is detected when the corresponding measured value of the at least one battery cell, detected by the slave sensors, approximately equals the measured value of the at least one of the battery cells detected by the master sensors.

7. The method as recited in claim 5, wherein a defect in at least one master sensor of the master supervision unit is detected when a corresponding measured value of the at least one battery cell detected by the slave sensors deviates significantly from the at least one of the measured values of the at least one battery cell detected by the master sensors.

8. The method as recited in claim 4, further comprising:
comparing the measured values of one of the battery modules, which are detected by the master sensors of the master supervision unit assigned to the one of the battery modules, with the measured values of other ones of the battery modules, which are detected by the master sensors of the master supervision units assigned to the other ones of the battery module;
comparing the measured values of the one of the battery modules, which are detected by the slave sensors of the slave supervision unit assigned to the one of the battery modules, with the measured values of the other ones of the battery modules, which are detected by the slave sensors of the slave supervision units assigned to the other ones of the battery modules; and
detecting a defect when at least one of the measured values of the one of the battery modules detected by the master sensors of the master supervision unit assigned to the one of the battery modules deviates significantly from the measured values of the other ones of the battery modules detected by the master sensors of the master supervision units assigned to the other ones of the battery module.

9. The method as recited in claim 8, wherein a defect in the one of the battery modules is detected when one of the measured values of the one of the battery modules detected by the slave sensors of the slave supervision unit assigned to the one of the battery modules approximately equals a corresponding one of the measured values of the one of the battery module detected by the master sensors of the master supervision unit assigned to the one of the battery modules.

10. The method as recited in claim 8, wherein a defect in the master supervision unit assigned to the one of the battery modules is detected when a measured value of the one of the battery modules detected by the slave sensors of the slave supervision unit assigned to the one of the battery modules deviates significantly from corresponding measured value of the one of the battery modules detected by the master sensors of the master supervision unit assigned to the one of the battery modules.

11. The method as recited in claim 4, wherein a master function assigned to the master control unit is assigned to the slave control unit when a defect is detected in the master control unit and/or in a master supervision unit and/or in at least one master sensor of at least one master supervision unit.

12. The method as recited in claim 11, wherein at least one main switch for switching off the battery modules, which is connected in series to the battery modules, is controlled by a control unit of the master control unit or the slave control unit to which the master function is assigned when a defect is detected in at least one battery cell and/or in at least one battery module.

13. An electric vehicle, comprising:
a battery system including:
a plurality of serially interconnected battery modules, each of the battery modules having at least two battery cells interconnected in parallel;
a master control unit for supervising the battery modules; and
a slave control unit for supervising the battery modules;
wherein assigned to each of the battery modules is: (i) a respective master supervision unit having master sensors for detecting measured values of the battery cells of the battery modules and of the battery modules, and (ii) a respective slave supervision unit having slave sensors for detecting measured values of the battery cells of the battery modules and of the battery modules;
wherein the master supervision units are configured to communicate with the master control unit, slave supervision units are configured to communicate with the slave control unit, and the master control unit is configured to communicate with the slave control unit.

14. The device as recited in claim 13, wherein the battery system is configured to perform the following:
transmitting measured values of the battery cells and of the battery modules, detected by the master sensors, from the master supervision units to the master control unit, and from the master control unit to the slave control unit; and
transmitting measured values of the battery cells and of the battery modules, detected by the slave sensors, from the slave supervision units to the slave control unit, and from the slave control unit to the master control unit.

* * * * *